(12) United States Patent
Nakatani et al.

(10) Patent No.: US 9,410,987 B2
(45) Date of Patent: Aug. 9, 2016

(54) PROBE CARD

(71) Applicant: ROHM CO., LTD., Kyoto (JP)

(72) Inventors: Goro Nakatani, Kyoto (JP); Masahiro Sakuragi, Kyoto (JP); Koichi Niino, Kyoto (JP)

(73) Assignee: ROHM CO., LTD., Kyoto (JP)

(*) Notice: Subject to any disclaimer, the term of this patent is extended or adjusted under 35 U.S.C. 154(b) by 0 days.

(21) Appl. No.: 14/598,280

(22) Filed: Jan. 16, 2015

(65) Prior Publication Data
US 2015/0123691 A1 May 7, 2015

Related U.S. Application Data

(62) Division of application No. 12/998,228, filed as application No. PCT/JP2009/005002 on Sep. 29, 2009, now Pat. No. 8,970,242.

(30) Foreign Application Priority Data

Sep. 30, 2008 (JP) .................. 2008-253083
Sep. 30, 2008 (JP) .................. 2008-253700

(51) Int. Cl.
*G01R 1/073* (2006.01)
*H05K 3/40* (2006.01)
(Continued)

(52) U.S. Cl.
CPC ........ *G01R 1/07307* (2013.01); *G01R 1/07342* (2013.01); *G01R 31/26* (2013.01);
(Continued)

(58) Field of Classification Search
CPC ........... G01R 31/2831; G01R 31/2867; G01R 31/2886; G01R 31/2889; G01R 31/26; G01R 1/0491; G01R 1/067; G01R 1/07342; G01R 1/07307; H01L 21/4846; H01L 21/02104; H01L 22/32; H01L 24/81; H01L 2224/13624; H05K 3/445; H05K 1/0271
USPC ............. 324/756.03, 755.01, 750.24, 754.07, 324/754.04, 754.11, 756.07, 758.01, 762.01
See application file for complete search history.

(56) References Cited

U.S. PATENT DOCUMENTS 5,210,485 A * 5/1993 Kreiger .............. G01R 1/07314
29/846
5,672,977 A * 9/1997 Yamada ............... G01R 1/0735
324/754.14
(Continued)

FOREIGN PATENT DOCUMENTS

JP         9-126833 A    5/1997
JP      2000-171483 A    6/2000
(Continued)

*Primary Examiner* — Patrick Assouad
*Assistant Examiner* — Sean Curtis
(74) *Attorney, Agent, or Firm* — Rabin & Berdo, P.C.

(57) ABSTRACT

A probe card includes a board or silicon substrate; a plurality of probes (terminals) at a first surface of the board, the respective probes having a first extending portion extending along the first surface of the board; a plurality of through-holes formed in correspondence to the respective probes and penetrating between the first and second surfaces of the board; through electrodes embedded in the respective through-holes and conductively connected to the probes in the respective through-holes; and a wiring at the second surface of the board conductively connected to the through electrodes, the wiring having a second extending portion extending along the second surface of the board, wherein the first extending portion and the second extending portion extend in different directions from each other, and a space is formed across the entire width of the first extending portion between the first extending portion and the first surface of the board.

20 Claims, 13 Drawing Sheets

(51) Int. Cl.
*G01R 31/26* (2014.01)
*G01R 3/00* (2006.01)

(52) U.S. Cl.
CPC ............... *H05K 3/4084* (2013.01); *G01R 3/00* (2013.01); *H05K 2203/0195* (2013.01); *Y10T 29/41* (2015.01); *Y10T 29/49002* (2015.01); *Y10T 29/49147* (2015.01); *Y10T 29/49149* (2015.01); *Y10T 29/49151* (2015.01); *Y10T 29/49155* (2015.01); *Y10T 29/49165* (2015.01)

(56) References Cited

U.S. PATENT DOCUMENTS

| | | | | | |
|---|---|---|---|---|---|
| 5,831,441 | A | * | 11/1998 | Motooka | G01R 1/07364 324/756.07 |
| 6,331,811 | B2 | * | 12/2001 | Shibuya | 338/307 |
| 6,667,627 | B2 | * | 12/2003 | Tanioka | G01R 1/07378 29/842 |
| 6,836,011 | B2 | * | 12/2004 | Azuma | H01L 21/4853 257/700 |
| 6,912,778 | B2 | * | 7/2005 | Ahn | G01R 31/2831 29/846 |
| 6,953,712 | B2 | * | 10/2005 | Usui | H01L 21/4846 257/E23.077 |
| 6,975,127 | B2 | * | 12/2005 | DiOrio | G01R 1/0483 324/754.08 |
| 7,196,531 | B2 | * | 3/2007 | Grube | G01R 1/07314 324/756.03 |
| 7,378,732 | B2 | * | 5/2008 | Yamano | H01L 23/3114 257/675 |
| 7,948,252 | B2 | * | 5/2011 | Grube | G01R 1/07314 324/754.07 |
| 7,952,373 | B2 | * | 5/2011 | Mok | G01R 1/07342 324/750.24 |
| 7,982,482 | B2 | * | 7/2011 | Yamada | G01R 31/2891 324/756.03 |
| 8,344,748 | B2 | * | 1/2013 | Khoo | G01R 1/06727 324/755.04 |
| 8,970,242 | B2 | * | 3/2015 | Nakatani | G01R 1/07342 216/17 |
| 2001/0019301 | A1 | * | 9/2001 | Shibuya | H01C 3/04 338/308 |
| 2002/0030577 | A1 | * | 3/2002 | Shibuya | H01C 3/04 338/308 |
| 2002/0134686 | A1 | * | 9/2002 | Kobayashi | C23C 26/00 205/186 |
| 2004/0207082 | A1 | * | 10/2004 | Yamano | H01L 23/3114 257/738 |
| 2005/0036374 | A1 | * | 2/2005 | Nakashima | G01R 31/2889 365/202 |
| 2005/0083072 | A1 | * | 4/2005 | Mori | G01R 1/06733 324/756.03 |
| 2006/0017133 | A1 | * | 1/2006 | Oi | H01L 21/6835 257/528 |
| 2006/0201201 | A1 | * | 9/2006 | Fushie | H05K 3/0023 65/33.1 |
| 2007/0139061 | A1 | * | 6/2007 | Eldridge | G01R 1/18 324/750.27 |
| 2008/0048686 | A1 | * | 2/2008 | Sato | G01R 1/0735 29/825 |
| 2008/0184559 | A1 | | 8/2008 | Soma et al. | |
| 2008/0185729 | A1 | * | 8/2008 | Yamaguchi | H01L 23/49833 257/774 |
| 2008/0265933 | A1 | * | 10/2008 | Tanioka | G01R 31/2886 324/756.04 |
| 2009/0219042 | A1 | * | 9/2009 | Sasaki | G01R 1/07314 324/756.03 |
| 2009/0278561 | A1 | * | 11/2009 | Jo | G01R 1/06716 324/756.03 |
| 2010/0001748 | A1 | * | 1/2010 | Sasaki | G01R 31/2889 324/754.07 |
| 2010/0219852 | A1 | * | 9/2010 | Yamada | G01R 1/06722 324/756.03 |
| 2010/0258944 | A1 | * | 10/2010 | Uchiyama | H01L 23/5384 257/773 |
| 2014/0061940 | A1 | * | 3/2014 | Kitao | H01L 23/481 257/774 |

FOREIGN PATENT DOCUMENTS

| | | | |
|---|---|---|---|
| JP | 2000-193682 A | | 7/2000 |
| JP | 2004-245669 A | | 9/2004 |
| JP | 2004245671 A | * | 9/2004 |
| JP | 2006-300617 A | | 11/2006 |
| JP | 2007-086025 A | | 4/2007 |
| JP | 2008-191027 A | | 8/2008 |

* cited by examiner

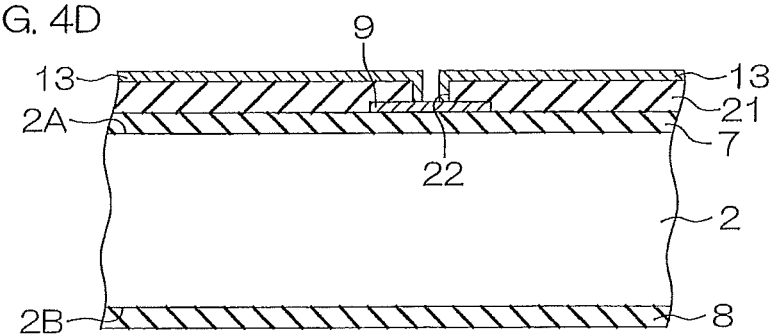
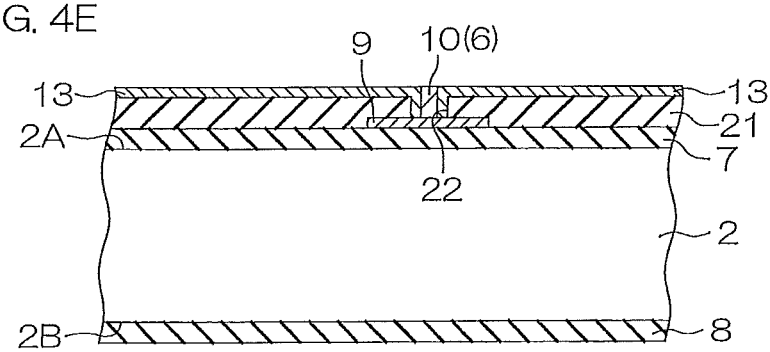
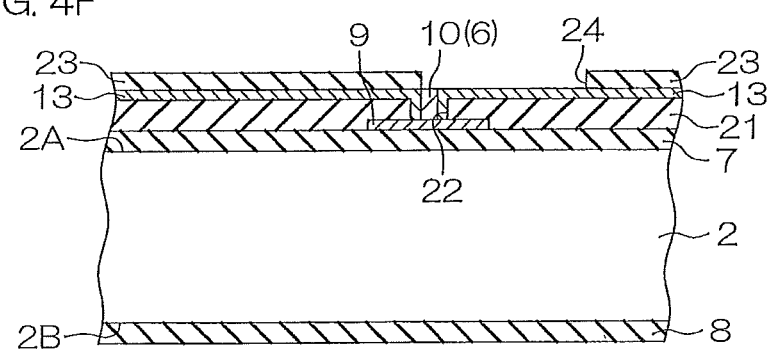

PROBE CARD

CROSS REFERENCE TO RELATED APPLICATION

This application is a divisional of application Ser. No. 12/998,228, filed on Mar. 29, 2011. Furthermore, this application claims the benefit of priority of Japanese applications 2008-253700, filed Sep. 30, 2008, and 2008-253083, filed Sep. 30, 2008. The disclosures of these prior U.S. and Japanese applications are incorporated herein by reference.

FIELD OF THE ART

The present invention relates to a probe card, a method for manufacturing the probe card, a method for manufacturing semiconductor device that uses the probe card, and a method for forming a probe.

BACKGROUND ART

A prober device is conventionally known as a device for inspecting electrical characteristics of respective semiconductor chips (semiconductor devices) prepared on a semiconductor wafer. A probe card is mounted to the prober device. With the probe card, the semiconductor chips on the semiconductor wafer are inspected one chip at a time. In the probe card, inspection probes are disposed so as to match a layout of all external terminals (input terminals and output terminals) of each semiconductor chip.

To inspect the semiconductor chips using the prober device, first, the probe card is positioned above one semiconductor chip on the semiconductor wafer. The probes are then brought in contact with all of the external terminals so that one probe corresponds to one external terminal. Electrical signals are then input into the input terminals of the semiconductor chip from the prober device. Electrical signals output from the output terminals of the semiconductor chip in accordance with the input signals are then read by the probe device, and signal waveforms of the output signals are compared with expected values stored in the probe device in advance. By this comparison, the qualities of the electric characteristics of the inspected chip are judged.

Meanwhile, in recent years, semiconductor chips are being further reduced in size and circuits are being made finer, and along with these trends, the external terminals provided in the chips are being made progressively narrower in pitch. Tip portions of the probes that contact the external terminals during inspection of the semiconductor chip must thus be made narrower in pitch. However, if just the magnitudes of the pitch of the tip portions of the probes are adjusted to match the pitch of the external terminals, the tip portions of adjacent probes may contact each other and cause a short circuit to occur between the tip portions and thereby lower the precision of inspection.

There has thus been proposed a method for forming probes with which the tip portions of the probes are made thinner than other portions by polishing by electric discharge machining after preparation of the probes to prevent mutual contact of adjacent probes and achieve narrowing of the pitch of the tip portions of the probes.

PRIOR ART DOCUMENTS

Patent Documents

Patent Document 1: Japanese Published Unexamined Patent Application No. 2007-86025

SUMMARY OF THE INVENTION

Object(s) of the Invention

With the conventional probe card, semiconductor chips can only be inspected one chip at a time. Thus, an extremely long time is required to inspect all of the chips on a semiconductor wafer. In addition, with the number of chips on a wafer increasing with the recent promotion of reduction in chip size of semiconductor chips, the inspection time is becoming even longer than before.

There is thus an idea of shortening the time required for inspection of semiconductor chips by inspecting a plurality of semiconductor chips in a batch and thereby improving inspection throughput.

Realization of this idea requires a probe card that is capable of batch inspection of a plurality of semiconductor chips. However, a probe card is prepared one by one by manual work by a skilled worker, and the preparation of such a probe card requires an extremely large amount of time and an extremely high manufacturing cost.

Also, with the conventional method for forming probes, although the tip portions of the probes can be made thin, trouble must be taken to process the tip portions after preparing the probes once. The work is thus extreme troublesome and manufacturing efficiency is lowered.

An object of the present invention is to provide a method for manufacturing probe card that enables easy and low-cost manufacture of a probe card capable of inspecting electrical characteristics of a plurality of semiconductor devices in a batch, a probe card obtained by the manufacturing method, and a method for manufacturing a semiconductor device using the probe card.

Another object of the present invention is to provide a method for forming probe that enables easy forming of probes that can accommodate the narrowing of pitch of external terminals of a semiconductor device.

Means for Solving the Problem

A method for manufacturing probe card according to the present invention is a method for manufacturing a probe card for inspection of electrical characteristics of a plurality of semiconductor devices in a batch and includes a step of forming a plurality of probes at one surface side of a board forming a base body of the probe card, the plurality of probes being to be brought in contact with external terminals of the semiconductor devices, a step of forming a plurality of through-holes in the board that reach the probes from another surface of the board by photolithography and etching, a step of forming through electrodes conductively connected to the probes in the respective through-holes, and a step of forming a wiring on the other surface side of the board, the wiring being conductively connected to the through electrodes.

By this method, the plurality of probes are formed on the one surface side of the board that forms the base body of the probe card. The plurality of thorough holes that reach the respective probes from the other surface are formed in the board by photolithography and etching. The through electrodes that are conductively connected to the probes are formed in the respective through-holes. The wiring that is conductively connected to the through electrodes is formed on the other surface side of the board.

For example, in a probe card preparation process carried out by a skilled worker, a plurality of extremely fine probes are positioned using tweezers, etc., on one surface of a ceramic substrate that forms a base body of a probe card. The probes are then routed to the other surface side of the ceramic substrate via a single large opening opened in a substantially central portion of the ceramic substrate. The routed probes are then connected by manual work to a wiring that is formed separately on the other surface of the ceramic substrate. Such complicated work must be performed for each and every probe, and preparation of the probe card thus requires a long time and a high cost.

On the other hand, with the above-described method, the plurality of through-holes are formed using photolithography and etching techniques that are adopted in a semiconductor device manufacturing process and conduction of the respective probes and the wiring is achieved via the through electrodes formed in the respective through-holes. A single probe can thus be connected to the wiring via a single penetrating electrode using techniques adopted in a semiconductor device manufacturing process. A connecting time per probe can thus be shortened. A larger number of probes can thus be connected to the wiring without increasing the time for manufacturing the probe card in comparison to the conventional art. Consequently, a probe card capable of inspecting a plurality of semiconductor devices in a batch can be manufactured easily at low cost.

Also, by this manufacturing method, for example, a probe card according to the present invention can be manufactured. That is, a probe card can be manufactured that includes a silicon-based board, a plurality of probes formed on one surface side of the silicon-based board and brought in contact with external terminals of a semiconductor device, a plurality of through-holes formed in correspondence to the respective probes and penetrating between the one surface of the silicon-based board and another surface at an opposite side of the silicon-based board, through electrodes embedded in the through-holes and conductively connected to the probes, and a wiring formed on the other surface side of the silicon-based board and conductively connected to the through electrodes, and where the probes are arranged in a plurality of sets with each set being made up of a plurality of probes that are disposed in a predetermined pattern.

With this probe card, the plurality of sets of the probes are provided with each set being made up of the plurality of probes, and thus, a plurality of semiconductor chips can be inspected in a batch. Throughput in inspection can thus be improved. Consequently, time required for inspection of semiconductor chips can be shortened.

Also, with the method for manufacturing probe card, the probes, the through electrodes, and the wiring are preferably formed by a plating method.

In this case, the probes, the through electrodes, and the wiring are formed by the plating method. The probe card can be manufactured at lower cost and more easily because the probes, the through electrodes, and the wiring are formed by such a simple process as the plating method. Increase in equipment cost can also be suppressed because the probes, the through electrodes, and the wiring can be formed using the same plating apparatus.

Also, a method for manufacturing semiconductor device according to the present invention includes a step of forming a plurality of semiconductor chips on a semiconductor wafer, each semiconductor chip having a plurality of external terminals for electrical connection, a step of inspecting electrical characteristics of the semiconductor chips with a probe card, and a step of dividing the semiconductor wafer into the respective semiconductor chips after the inspection, and with this method, the probe card includes a silicon-based board, a plurality of probes formed on one surface side of the silicon-based board and brought in contact with the external terminals of the semiconductor chips, a plurality of through-holes formed in correspondence to the respective probes and penetrating between the one surface of the silicon-based board and another surface at an opposite side of the silicon-based board, through electrodes embedded in the through-holes and conductively connected to the probes, and a wiring formed on the other surface side of the silicon-based board and conductively connected to the through electrodes, the probes are arranged in a plurality of sets with each set being made up of a plurality of probes that are disposed in a predetermined pattern, and in the inspection, the electrical characteristics of the plurality of semiconductor chips are inspected in a batch by making a single set of the probes contact the external terminals of a single semiconductor chip and inputting electrical signals into the respective external terminals.

By this manufacturing method, the electrical characteristics of the plurality of semiconductor chips are inspected in a batch using the probe card according to the present invention, and the throughput in the inspection can thus be improved. Consequently, the time required for inspection of the semiconductor chips can be shortened and manufacturing efficiency of the semiconductor devices can be improved.

A method for forming probe according to the present invention is a method for forming a probe used for inspecting electrical characteristics of a semiconductor device and having a tip portion of relatively small thickness that contacts an external terminal of the semiconductor device and a support portion of relatively large thickness that supports the tip portion, and the method includes a step of forming a plating underlayer made of a metal material on a surface of a semiconductor substrate, a step of selectively forming a first plating layer with the same thickness as the tip portion on the plating underlayer by a plating method, a step of forming a mask covering a predetermined portion of the first plating layer, and a step of forming a second plating layer on a portion of the first plating layer that is exposed from the mask by a plating method, the second layer having a thickness equal to the thickness of the support portion minus the thickness of the tip portion.

By this method, the probe is formed and the probe is used for inspecting electrical characteristics of the semiconductor device and the probe has the tip portion of relatively small thickness that contacts the external terminal of the semiconductor device and the support portion of relatively large thickness that supports the tip portion. Specifically, the first plating layer with the same thickness as the tip portion is selectively formed by the plating method on the plating underlayer formed on the surface of the semiconductor substrate. After forming of the first plating layer, the predetermined portion of the first plating layer is covered by the mask. The second plating layer having the thickness equal to the thickness of the support portion minus the thickness of the tip portion is then formed by the plating method on the portion of the first plating layer that is exposed from the mask. The tip portion is thereby formed at the first plating layer portion covered by the mask, and the support portion is formed at the portion that is not covered by the mask.

That is, with the probe formed by the above method, the tip portion is made of the first plating layer, and the support portion is made of the first plating layer and the second plating layer. The thickness of the tip portion is thus made relatively small and the thickness of the support portion is made relatively large. Thus, even if the probes are made narrow in pitch in accordance with a pitch of the external terminals of the semiconductor device, mutual contact of adjacent probes can be prevented by designing the thickness of the first plating layer to be an appropriate thickness. Probes that can accommodate the narrowing of the pitch of the external terminals of the semiconductor device can thus be formed. Consequently, the electrical characteristics of the semiconductor device can be inspected with good precision using the probes formed by the above method.

Further, the tip portion of relatively small thickness is formed by the plating method in the probe forming process. There is thus no need to polish or otherwise process the tip portion after probe preparation. Probes having tip portions of relatively small thickness can thus be formed easily without trouble.

Also, preferably with the above method for forming probe, an outer frame that surrounds the probe and a connecting portion that connects the outer frame to the probe are formed along with the probe, the outer frame is made of the first plating layer and the second plating layer, and the connecting portion is made of the first plating layer.

In this case, the outer frame that surrounds the probe and the connecting portion that connects the outer frame to the probe are formed. The probe is supported by the outer frame via the connecting portion and thus by separating the outer frame from the semiconductor substrate, the probe can be separated easily from the semiconductor substrate in accompaniment.

Further, the outer frame is made of the first plating layer and the second plating layer, and the connecting portion is made of the first plating layer. The outer frame and the connecting portion can thus be formed in the same process as the probe. Also, the connecting portion is formed of the first plating layer of relatively small thickness, and thus the probe and the connecting portion can be separated easily after separation of the outer frame (probe) and the semiconductor substrate.

Also, preferably with the above method for forming probe, the step of forming the first plating layer is a step of forming the first plating layer using a metal material that differs from that of the plating underlayer.

In this case, the first plating layer is formed using the metal material that differs from that of the plating underlayer. If the metal material differs, an etching rate with respect to a specific etching solution differs. The first plating layer can thus be separated easily from the semiconductor substrate by a lift-off method that makes use of a difference of the etching rates of the first plating layer and the plating underlayer.

BRIEF DESCRIPTION OF THE DRAWINGS

FIG. 4D is a schematic sectional view of a step subsequent to the step of FIG. 4C.

FIG. 4E is a schematic sectional view of a step subsequent to the step of FIG. 4D.

FIG. 4F is a schematic sectional view of a step subsequent to the step of FIG. 4E.

PREFERRED EMBODIMENT(S) OF THE INVENTION

Preferred embodiments of the present invention shall now be described in detail with reference to the attached drawings.

Figure 1:
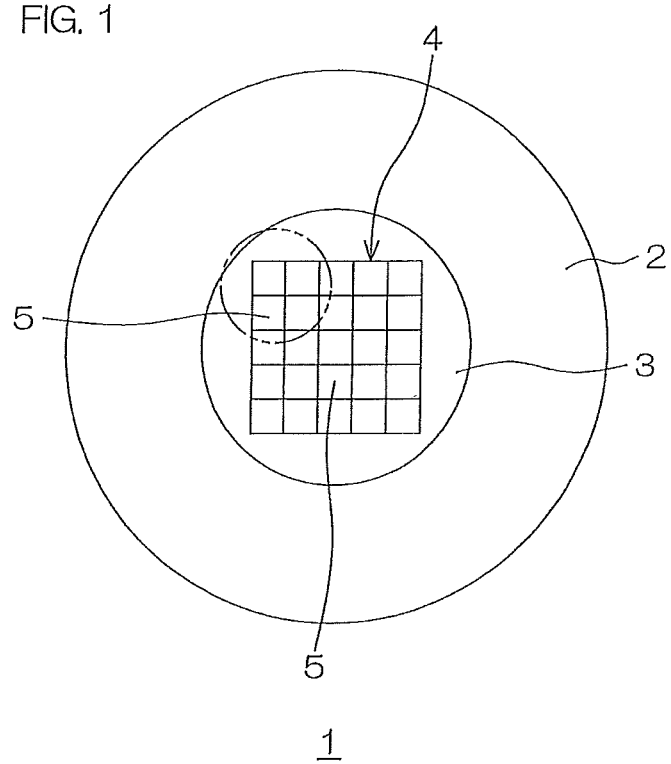
FIG. 1 is a schematic plan view of a probe card according to a preferred embodiment of the present invention.

FIG. 1 is a schematic plan view of a probe card according to a preferred embodiment of the present invention.

The probe card 1 is a device for performing batch inspection of electrical characteristics of a plurality of semiconductor chips (semiconductor devices) formed on a semiconductor wafer and includes a silicon substrate 2 as a disk-shaped silicon-based board.

A wiring unit 3, having a circular shape in plan view and in which probes, wiring, etc., necessary for inspecting the semiconductor chips are disposed, is formed in a substantially central portion of the silicon substrate 2. An inspection portion 4 of substantially square shape in plan view is formed in the wiring unit 3. The inspection portion 4 is partitioned, for example, into 5×5 lattice windows. Each lattice window portion partitioned in the inspection portion 4 makes up a unit cell 5 corresponding to a single chip among the semiconductor chips and is formed to a square shape in plan view.

Figure 2:
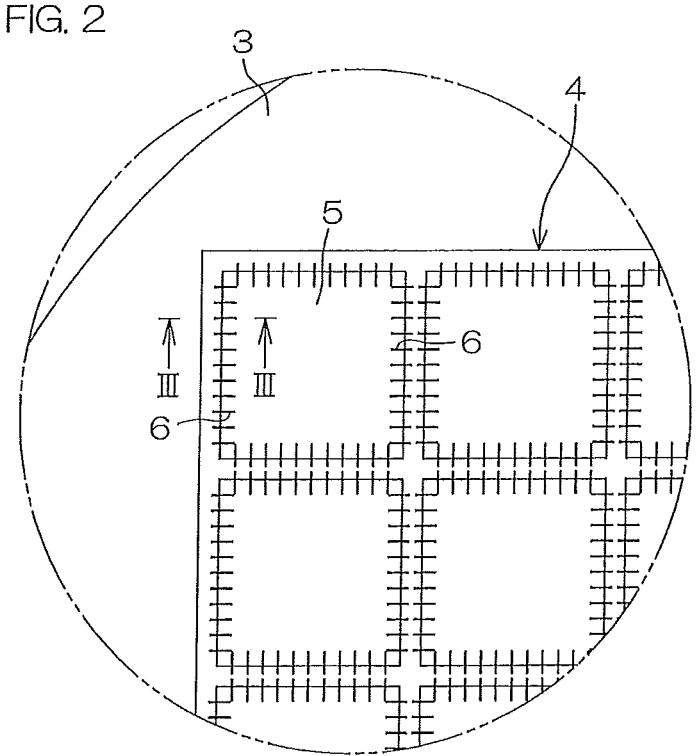
FIG. 2 is an enlarged view of a portion surrounded by the alternate long and two short dashed lines circle shown in FIG. 1.

FIG. 2 is an enlarged view of a portion surrounded by the alternate long and two short dashed lines circle shown in FIG. 1.

Each unit cell 5 is provided with probes 6. The probes 6 are provided as a set of the same number as external terminals (for example, electrode pads 54 to be described below) of a single chip (for example, each semiconductor chip 53 to be described below) among the semiconductor chips, and are aligned at each side of the unit cell 5 at a pitch matching a pitch of the external terminals of the semiconductor chip that is the subject of inspection.

Figure 3:
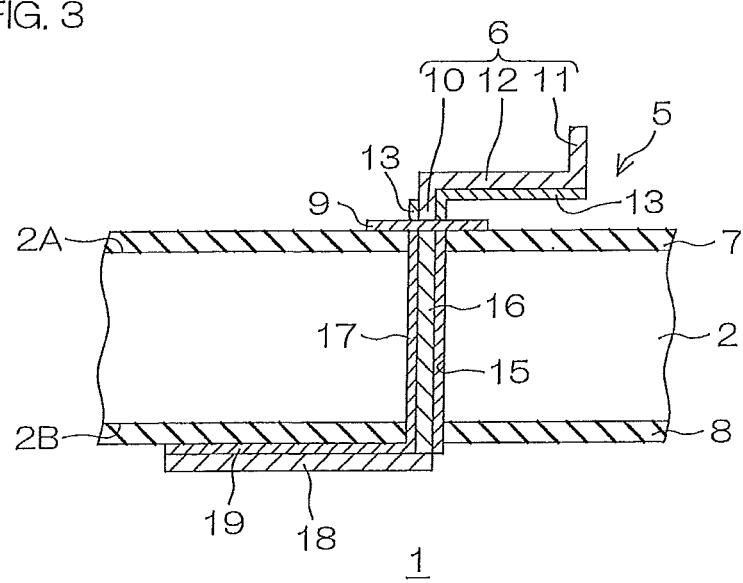
FIG. 3 is a sectional view of a unit cell shown in FIG. 2 taken along sectioning line III-III.

FIG. 3 is a sectional view of the unit cell shown in FIG. 2 taken along sectioning line III-III.

An oxide film 7 and an oxide film 8, each made of silicon oxide, are formed at one surface 2A and another surface 2B, respectively, of the silicon substrate 2.

A substrate wiring 9 is selectively formed on the oxide film 7. The substrate wiring 9 is made, for example, of aluminum.

The probes 6 are connected to the substrate wiring 9. Each probe 6 integrally includes a first vertical portion 10 extending vertically upward from the substrate wiring 9 with respect to the one surface 2A of the silicon substrate 2, a second vertical portion 11 having a lower end positioned on substantially the same plane as an upper end of the first vertical portion 10 and extending vertically upward with respect to the one surface 2A of the silicon substrate 2, and a connecting portion 12 formed across inner and outer sides of the unit cell 5 parallel to the one surface 2A of the silicon substrate 2 and connecting the upper end of the first vertical portion 10 and the lower end of the second vertical portion 11. The probe 6 is thereby formed to a crank shape lifted above a surface of the oxide film 7.

Also, the probe 6 is made of a metal that can be formed by a plating method and is made, for example, of nickel or a nickel alloy (for example, a nickel-manganese alloy, etc.). By the probe 6 being made of such a metal and having the crank shape, the probe 6 can be provided with a suitable spring characteristic. By such a spring characteristic, the probe 6 can be made to contact an external terminal satisfactorily and yet damaging of the external terminal due to contact with the probe 6 can be suppressed.

One side surface of the first vertical portion 10 of the probe 6 that faces an exterior of the unit cell 15 is covered by a seed film 13. The other side surface of the first vertical portion 10 (surface facing an interior of the unit cell 5) and a surface of the connecting portion 12 opposing to the silicon substrate 2 are also covered by the seed film 13. The seed film 13 is an underlayer film for growing the probe 6 by plating and is made, for example, of a Ti/Cu laminated film or a TiW/Au laminated film, etc.

Also, in the probe card 1, a through-hole 15 penetrating through the silicon substrate 2 and the oxide film 7 is formed from a portion of a surface of the oxide film 8 that opposes the substrate wiring 9 via the silicon substrate 2.

A through electrode 16 is embedded in the through-hole 15. The through electrode 16 is thereby electrically connected to the probe 6 via the substrate wiring 9. The through electrode 16 is made of a low resistance metal suitable as a wiring material and capable of being formed by a plating method and is made, for example, of copper or a titanium/titanium nitride/aluminum-copper alloy (Ti/TiN/Al—Cu), etc.

A seed film 17 is interposed across an entire region between the through electrode 16 and an inner surface of the through-hole 15. The seed film 17 is an underlayer film for growing the through electrode 16 by plating and is made, for example, of a Ti/Cu laminated film or a TiW/Au laminated film, etc.

On the oxide film 8, a routed wiring 18 that is electrically connected to the through electrode 16 and is routed along the oxide film 8 is formed in a predetermined pattern. The routed wiring 18 is made of a low resistance metal suitable as a wiring material and capable of being formed by a plating method and is made, for example, of copper or a titanium/titanium nitride/aluminum-copper alloy (Ti/TiN/Al—Cu), etc.

A seed film 19 is interposed between the routed wiring 18 and the oxide film 8. The seed film 19 is an underlayer film for growing the routed wiring 18 by plating and is made, for example, of a Ti/Cu laminated film or a TiW/Au laminated film, etc.

Figure 4A:
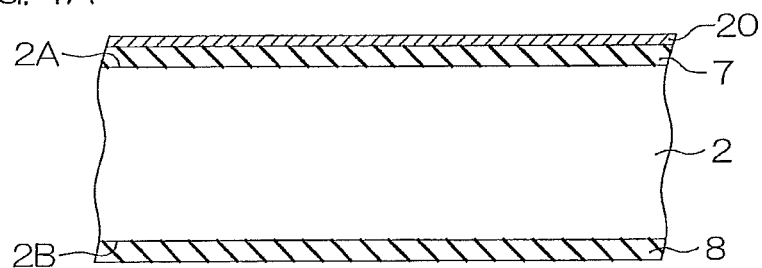
FIG. 4A is a schematic sectional view illustrating a method for manufacturing the probe card shown in FIG. 1.
Figure 4B:
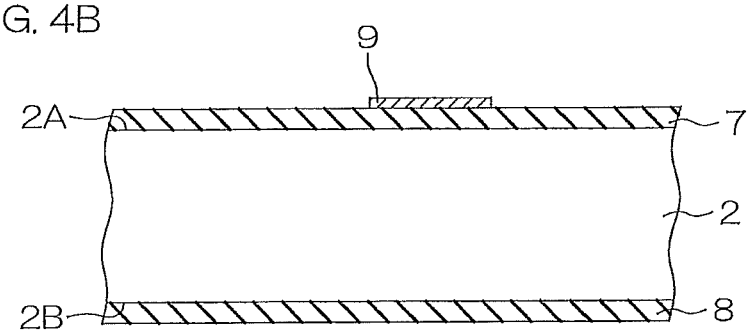
FIG. 4B is a schematic sectional view of a step subsequent to the step of FIG. 4A.
Figure 4C:
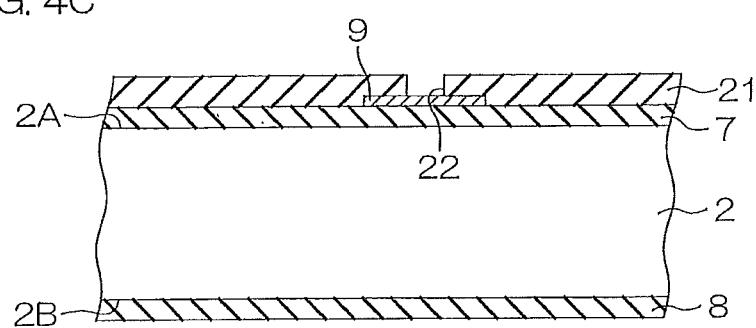
FIG. 4C is a schematic sectional view of a step subsequent to the step of FIG. 4B.
Figure 4G:
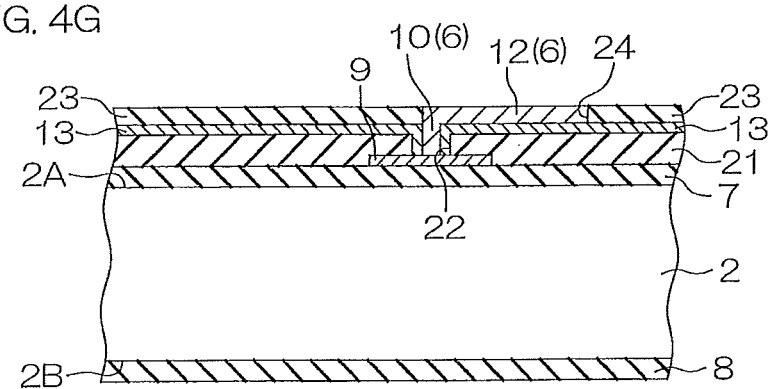
FIG. 4G is a schematic sectional view of a step subsequent to the step of FIG. 4F.
Figure 4H:
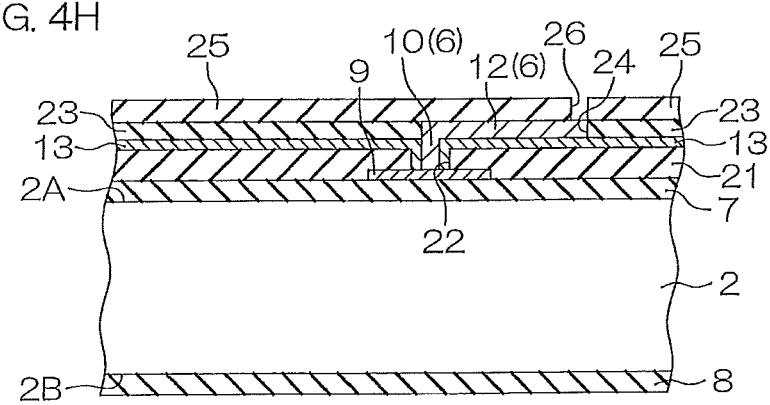
FIG. 4H is a schematic sectional view of a step subsequent to the step of FIG. 4G.
Figure 4I:
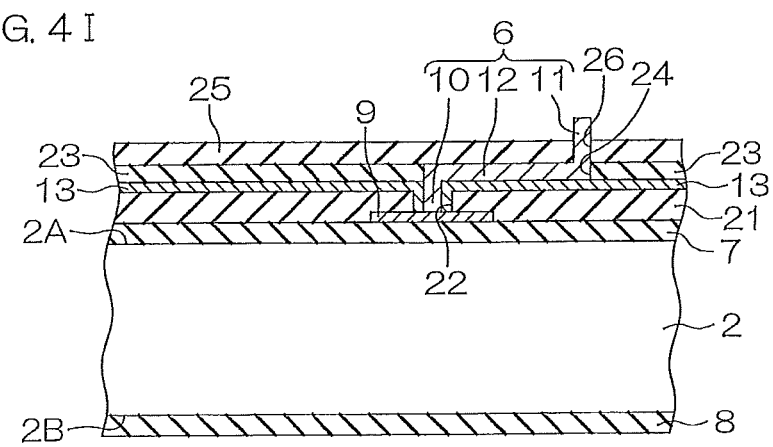
FIG. 4I is a schematic sectional view of a step subsequent to the step of FIG. 4H.
Figure 4J:
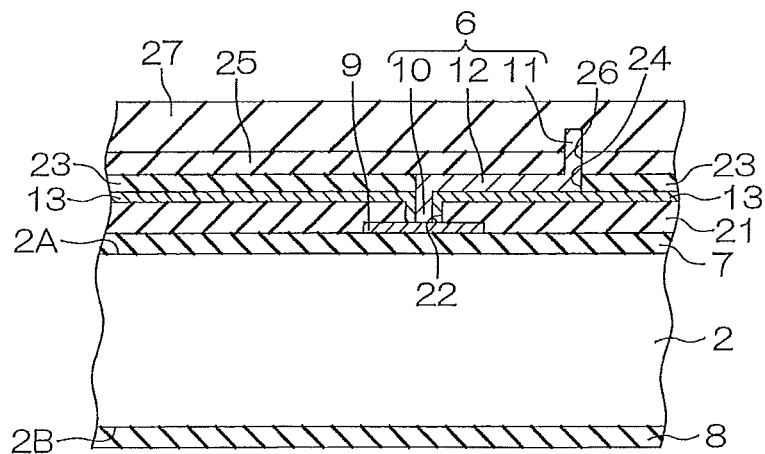
FIG. 4J is a schematic sectional view of a step subsequent to the step of FIG. 4I.
Figure 4K:
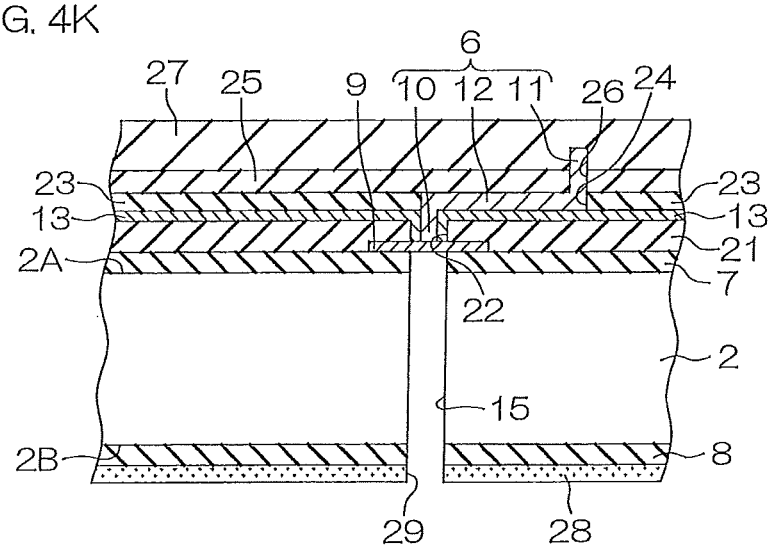
FIG. 4K is a schematic sectional view of a step subsequent to the step of FIG. 4J.
Figure 4L:
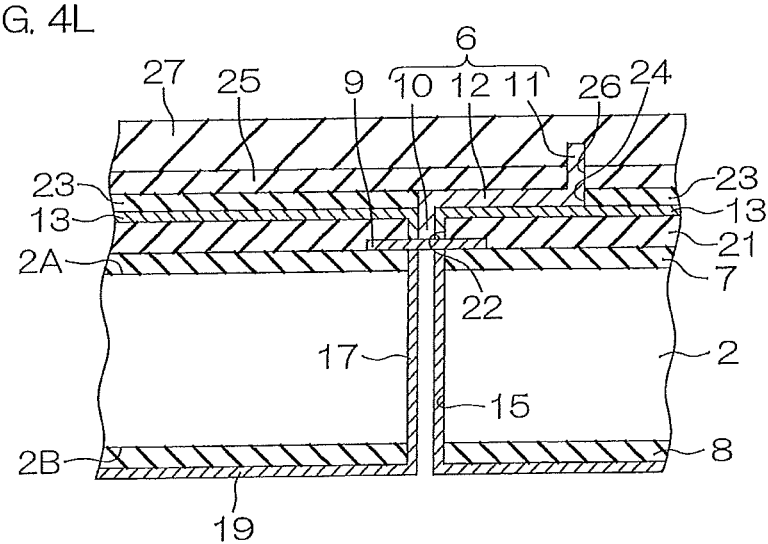
FIG. 4L is a schematic sectional view of a step subsequent to the step of FIG. 4K.
Figure 4M:
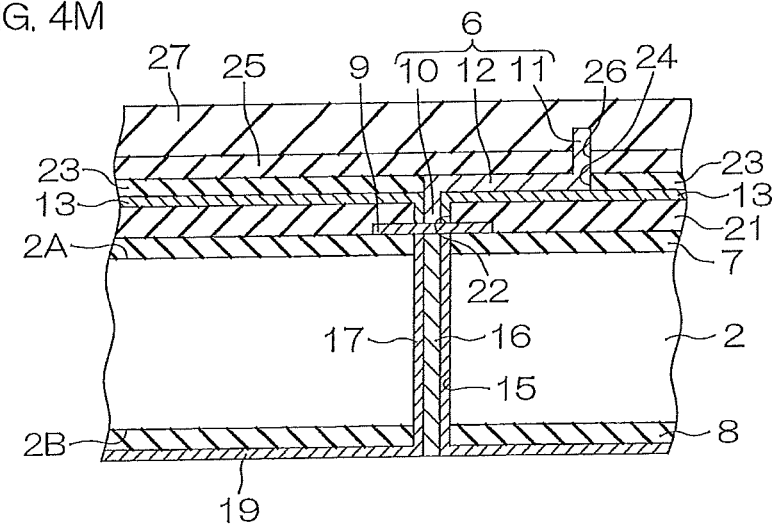
FIG. 4M is a schematic sectional view of a step subsequent to the step of FIG. 4L.
Figure 4N:
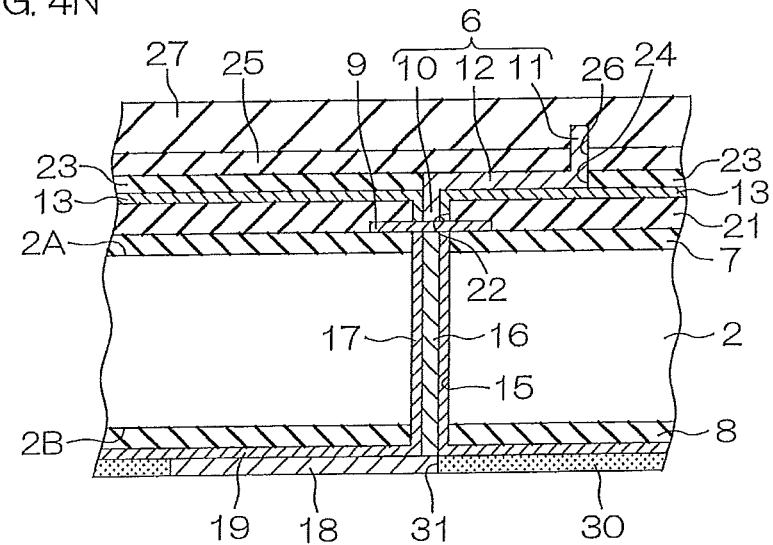
FIG. 4N is a schematic sectional view of a step subsequent to the step of FIG. 4M.
Figure 4O:
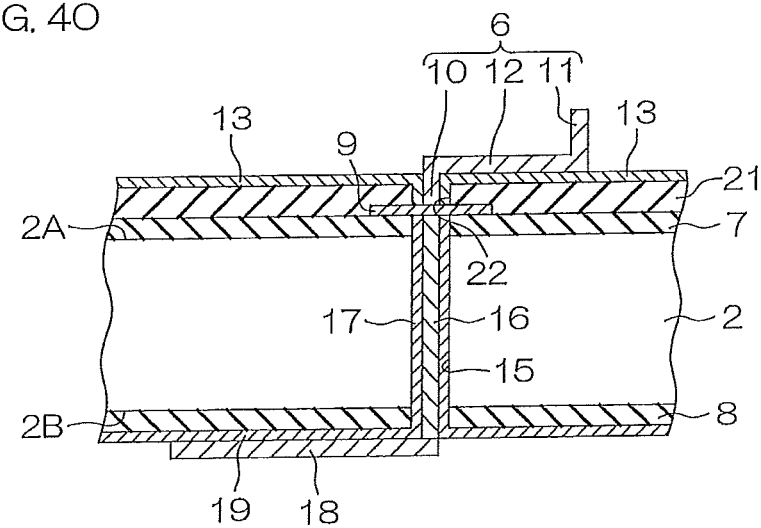
FIG. 4O is a schematic sectional view of a step subsequent to the step of FIG. 4N.
Figure 4P:
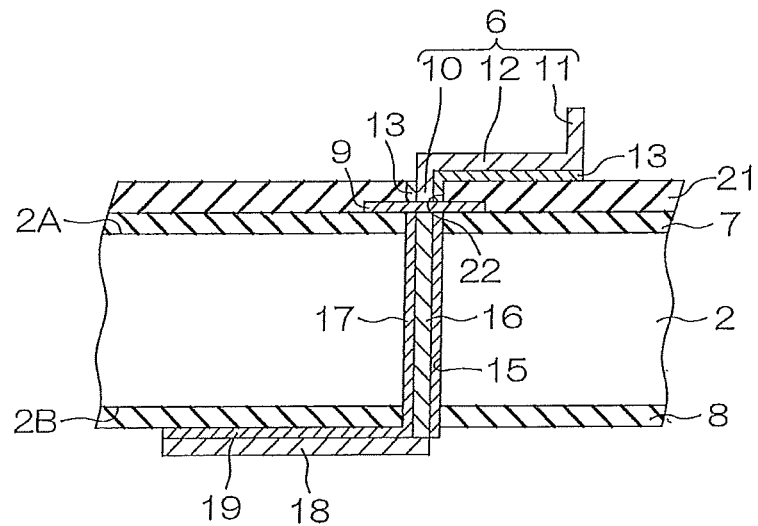
FIG. 4P is a schematic sectional view of a step subsequent to the step of FIG. 4O.
Figure 4Q:
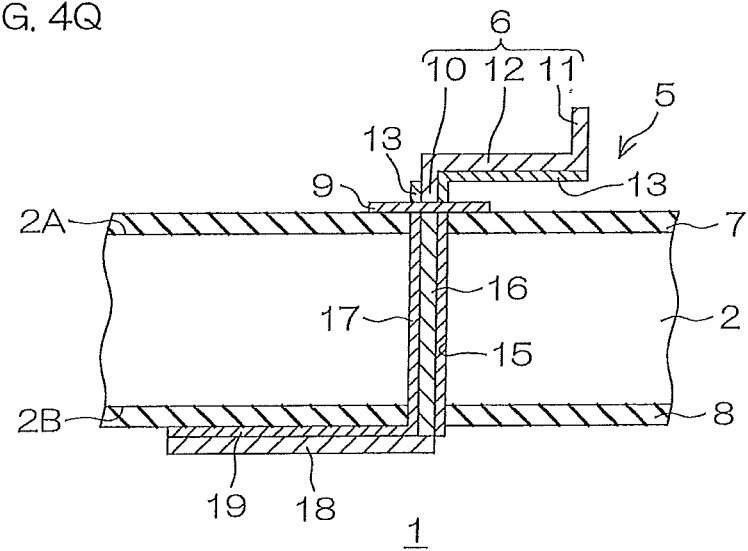
FIG. 4Q is a schematic sectional view of a step subsequent to the step of FIG. 4P.

FIG. 4A to FIG. 4Q are schematic sectional views illustrating, in order of process, a method for manufacturing the probe card shown in FIG. 1, and is a sectional view taken along the same sectioning plane as FIG. 3.

To manufacture the probe card 1, the oxide film 7 and the oxide film 8 are formed on the one surface 2A and the other surface 2B, respectively, of the silicon substrate 2 by a thermal oxidation process as shown in FIG. 4A. An aluminum film 20, which is a material of the substrate wiring 9, is then formed on the oxide film 7 by the sputter method.

Next, as shown in FIG. 4B, the aluminum film 20 is patterned by a photolithography technique and an etching technique. The substrate wiring 9 is thereby formed on the oxide film 7.

Next, as shown in FIG. 4C, a sacrificial film 21 is coated onto the oxide film 7. The sacrificial film 21 is made of an insulating material that can withstand sputtering of a metal material and is made, for example, of a polyimide or a low-k material (for example, SiOC), etc. The sacrificial film 21 is then patterned to a pattern of the first vertical portion 10 of the probe 6 by the photolithography technique and the etching technique. An opening 22, which has the same pattern as the first vertical portion 10 and partially exposes the substrate wiring 9, is thereby formed in the sacrificial film 21.

Next, as shown in FIG. 4D, the seed film 13 is formed by the sputter method on an inner surface of the opening 22 and an entire surface of the sacrificial film 21.

After forming of the seed film 13, the material of the probe 6 is grown by plating inside the opening 22 as shown in FIG. 4E. The plating growth is continued until the material completely fills the opening 22. The first vertical portion 10 of the probe 6 is thereby formed inside the opening 22.

Next, as shown in FIG. 4F, a sacrificial film 23 is coated onto the seed film 13. The sacrificial film 23 is made, for example, of the same material as the sacrificial film 21. The sacrificial film 23 is then patterned to the pattern of the connecting portion 12 of the probe 6 by the photolithography technique and the etching technique. A probe groove 24, which has the same pattern as the connecting portion 12 and partially exposes the seed film 13, is thereby formed in the sacrificial film 23.

Next, as shown in FIG. 4G, the material of the probe 6 is grown by plating inside the probe groove 24. The plating growth is continued until the material completely fills the probe groove 24. The connecting portion 12 of the probe 6 is thereby formed inside the probe groove 24.

Next, as shown in FIG. 4H, a sacrificial film 25 is coated onto the sacrificial film 21. The sacrificial film 25 is made, for example, of the same material as the sacrificial film 21. The sacrificial film 25 is then patterned to the pattern of the second vertical portion 11 of the probe 6 by the photolithography technique and the etching technique. An opening 26, which has the same pattern as the second vertical portion 11 and partially exposes the connecting portion 12, is thereby formed in the sacrificial film 25.

Next, as shown in FIG. 4I, the material of the probe 6 is grown by plating from the connecting portion 12. The plating growth is continued until the material projects above the sacrificial film 25 from the opening 26. The second vertical portion 11 of the probe 6 that projects above the sacrificial film 25 from the opening 26 is thereby formed.

Next, as shown in FIG. 4J, a protective film 27 is coated onto an entire surface of the sacrificial film 25. The protective film 27 is made, for example, of the same material as the sacrificial film 21 and is formed to a thickness of covering an entirety of the second vertical portion 11 that projects from the sacrificial film 25. The one surface 2A side of the silicon substrate 2 is thereby protected by the protective film 27.

Next, as shown in FIG. 4K, a mask 28 is coated onto the oxide film 8. As a material of the mask 28, a known photoresist or patterning material used in a semiconductor device manufacturing process is applied. The mask 28 is then patterned in the pattern of the through-hole 15. An opening 29 of the same pattern as the through-hole 15 is thereby formed at the position of the mask 28 opposing to the substrate wiring 9 via the silicon substrate 2. The oxide film 8, the silicon substrate 2, and the oxide film 7 are dry-etched via the opening 29. The through-hole 15 that penetrates through the silicon substrate 2 and the oxide film 7 from the surface of the oxide film 8 and reaches a rear surface of the substrate wiring 9 is thereby formed. After the forming of the through-hole 15, the mask 28 is removed by ashing.

Next, as shown in FIG. 4L, a seed film 17 is formed on an entire inner surface of the through-hole 15 and a seed film 19 is formed on an entire surface of the oxide film 8 by the sputtering method.

After forming of the seed film 17 and the seed film 19, the material of the through electrode 16 is grown by plating inside the through-hole 15 as shown in FIG. 4M. The plating growth is continued until the material completely fills the through-hole 15. The through electrode 16 that is embedded in the through-hole 15 is thereby obtained. The through electrode 16 that completely fills the through-hole 15 is thereby electrically connected to the probe 6 via the substrate wiring 9.

Next, as shown in FIG. 4N, a mask 30 is coated onto the seed film 19. As a material of the mask 30, for example, the same material as the mask 28 is applied. The mask 30 is then patterned in the pattern of the routed wiring 18. A wiring groove 31 having the same pattern as the routed wiring 18 and partially exposing the seed film 19 is thereby formed in the mask 30. The material of the routed wiring 18 is then grown by plating inside the wiring groove 31. The plating growth is continued until the material completely fills the wiring groove 31. The routed wiring 18 is thereby formed inside the wiring groove 31.

After the forming of the routed wiring 18, the mask 30 is removed by ashing as shown in FIG. 4O. The sacrificial film 23, the sacrificial film 25, and the protective film 27 above the seed film 13 are then removed in a batch by wet etching.

Next, as shown in FIG. 4P, a portion of the seed film 13 that is exposed from the probe 6 is removed by wet etching using an etching solution with a higher etching rate against the seed film 13 than against the probe 6. That is, the seed film 13 covered by the connecting portion 12 of the probe 6 remains even after the wet etching. Also, a portion of the seed film 19 that is exposed from the routed wiring 18 is removed by wet etching using an etching solution with a higher etching rate against the seed film 19 than against the routed wiring 18. That is, the seed film 19 covered by the routed wiring 18 remains even after the wet etching.

Next, as shown in FIG. 4Q, the sacrificial film 21 is removed by ashing and wet etching. The probe 6 is thereby put in the state of being lifted above the surface of the oxide film 7 and a gap of a predetermined interval is formed between the probe 6 and the oxide film 7.

The probe card 1 shown in FIG. 1 is obtained by the above process. Although in a process of manufacturing the probe card 1, a process of forming other members included in the probe card 1 is executed besides the process illustrated in FIG. 4A to FIG. 4Q, description of such a process is omitted here.

As described above, by the present method, the opening 22, the probe groove 24, and the opening 26 are formed in the sacrificial film 21, the sacrificial film 23, and the sacrificial film 25, respectively, by the photolithography technique and the etching technique (see FIGS. 4C, 4F, and 4H). Also, the first vertical portion 10, the connecting portion 12, and the second vertical portion 11 are respectively formed in the opening 22, the probe groove 24, and the opening 26 by the plating method (see FIGS. 4E, 4G, and 4I). The probe 6 is thereby formed on the one surface 2A side of the silicon substrate 2 (see FIG. 4I).

Also, the through-hole 15 is formed in the silicon substrate 2 by the photolithography technique and the etching technique (see FIG. 4K). The through electrode 16, conductively connected to the probe 6, is formed in the through-hole 15 by the plating method (see FIG. 4M).

At the other surface 2B side of the silicon substrate 2, the wiring groove 31 is formed in the mask 30 by the photolithography technique and the etching technique. Also, the routed wiring 18, conductively connected to the through electrode 16, is formed in the wiring groove 31 by the plating method (see FIG. 4N).

For example, in a probe card preparation process carried out by a skilled worker, a plurality of extremely fine probes are positioned using tweezers, etc., on one surface of a ceramic substrate that forms a base body of a probe card. The probes are then routed to the other surface side of the ceramic substrate via a single large opening opened at a substantially central portion of the ceramic substrate. The routed probes are then connected by manual work to a wiring that is formed separately on the other surface of the ceramic substrate. Such a complicated work must be performed for each and every probe, and preparation of the probe card thus requires a long time and a high cost.

On the other hand, with the above-described method, the probe 6, the through electrode 16, and the routed wiring 18 are formed to be conductive using the photolithography technique and the etching technique that are adopted in a semiconductor device manufacturing process. That is, a single probe 6 and the routed wiring 18 can be connected via a single through electrode 16 using the techniques adopted in a semiconductor device manufacturing process. A connecting time per probe can thus be shortened. A larger number of the probes 6 can thus be connected to the routed wiring 18 without increasing the time for manufacturing the probe card 1 in comparison to the conventional art. Consequently, the probe card 1 capable of inspecting a plurality of semiconductor chips in a batch can be manufactured easily at low cost.

Also, the probe card 1 can be manufactured at lower cost and more easily because the probe 6, through electrode 16, and routed wiring 18 are formed by such a simple process as the plating method. Increase in equipment cost can also be suppressed because the probe 6, the through electrode 16, and the routed wiring 18 can be formed using the same plating apparatus.

Also, by laminating the sacrificial film 21, the sacrificial film 23, and the sacrificial film 25 in three stages, forming the probe by forming the first vertical portion 10, the connecting portion 12, and the second perpendicular portion 11 in accordance with the lamination of the above films, and thereafter eliminating all of the three stages of the sacrificial film 21, the sacrificial film 23, and the sacrificial film 25, a gap can be formed easily between the probe 6 and the oxide film 7.

Also, after the probe 6 has been formed, the entirety of the second vertical portion 11 projecting from the sacrificial film 25 is covered by the protective film 27 until the forming of the routed wiring 18 is completed. The second vertical portion 11 can thus be protected from impact due to contact. Thus, in steps after the forming of the protective film 27 (lithography step, etching step, etc.), the silicon substrate 2 can be set on wafer stages of respective apparatuses in an orientation where the one surface 2A side is faced downward. Workability can thus be improved after the protective film 27 is formed.

With the probe card 1 that is obtained by the above method, the inspection portion 4 is partitioned into 5×5 lattice windows, and in each unit cell 5 of this layout, the same number of the probes 6 as the number of external terminals of a single chip among the semiconductor chips are provided as one set. A plurality of the semiconductor chips (25 chips in the present preferred embodiment) can thus be inspected in a batch. Throughput in the inspection can thus be improved. Consequently, time required for inspection of the semiconductor chips can be shortened.

The probe card 1 can be used, for example, in manufacture of a semiconductor device according to the present invention.

FIG. 5A to 5D are schematic sectional views illustrating a method for manufacturing a semiconductor device according to a preferred embodiment of the present invention.

Figure 5A:
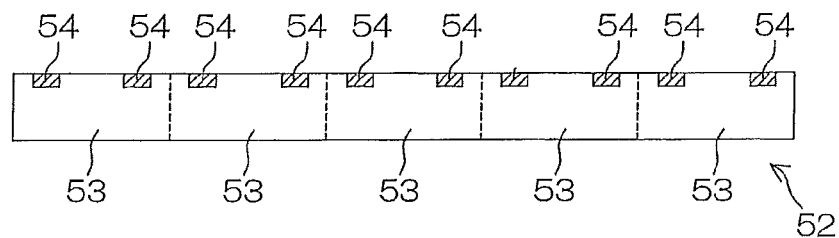
FIG. 5A is a schematic sectional view illustrating a method for manufacturing a semiconductor device according to a preferred embodiment of the present invention.
Figure 5B:
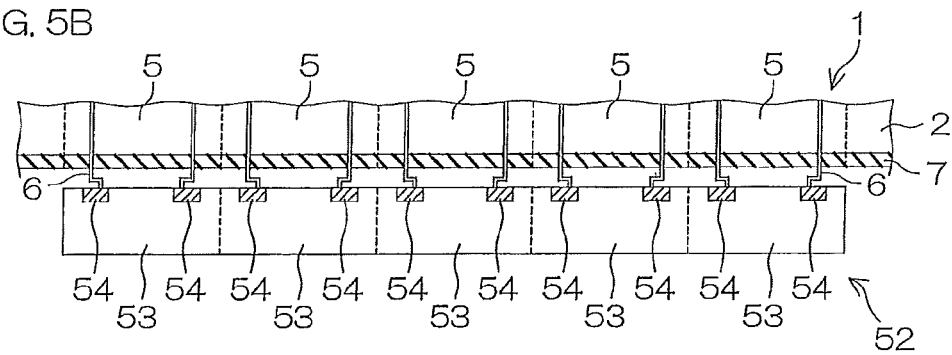
FIG. 5B is a schematic sectional view of a step subsequent to the step of FIG. 5A.

To manufacture the semiconductor device according to the preferred embodiment of the present invention, a plurality of semiconductor chips 53 of square shape are formed so as to be partitioned in lattice form on a disk-shaped semiconductor wafer 52, for example, as shown in FIG. 5A. In FIG. 5A and FIG. 5B, a boundary between mutually adjacent semiconductor chips 53 is indicated by broken lines.

Then, in each semiconductor chip 53, wirings (not shown) are formed, a surface protective film (not shown) is formed, and thereafter, openings are formed in the surface protective film so that the wirings at the topmost layer are exposed as electrode pads 54 for electrical connection. The electrode pads 54 are disposed at uniform pitch along each side of each semiconductor chip 53.

Next, as shown in FIG. 5B, the probe card 1 is used to inspect electrical characteristics of the semiconductor chip 53. In the inspection, the semiconductor chips 53 are positioned with respect to all of the unit cells 5 of the probe card 1 so that one unit cell 5 and one semiconductor chip 53 are matched in one-to-one manner. From this state, the single set of the probes 6 and the electrode pads 54 of each semiconductor chip 53 are brought in contact, and electrical signals are input in a batch into the electrode pads 54 of the plurality of semiconductor chips 53. Then, for example, electrical signals output from the electrode pads 54 in correspondence to the input signals are read by the probe device and the signal waveforms of the output signals are compared with expected values stored in the probe device in advance. By this comparison, the qualities of the electric characteristics of the plurality of semiconductor chips 53 are judged in one step.

Figure 5C:
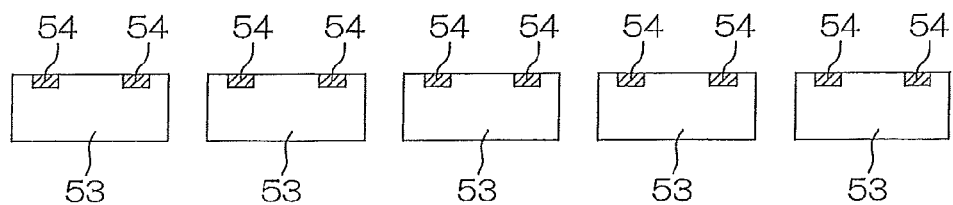
FIG. 5C is a schematic sectional view of a step subsequent to the step of FIG. 5B.
Figure 5D:
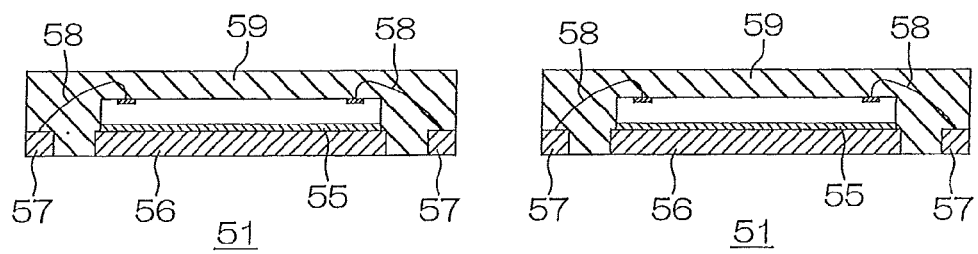
FIG. 5D is a schematic sectional view of a step subsequent to the step of FIG. 5C.

Next, as shown in FIG. 5C, the semiconductor wafer 52 is cut to sizes of the respective semiconductor chips 53 using, for example, a dicing saw and the individual semiconductor chips 53 are thereby obtained.

Thereafter, the respective semiconductor chips 53 are die bonded using a bonding agent 55 to respective die pads 56 of lead frames, and the respective electrode pads 54 are connected by bonding wires 58 to the respective leads 57 of the lead frames. The lead frames are then set in molding dies and all of the semiconductor chips 53 are sealed along with the lead frames by resin packages 59 in a batch. Lastly, the lead frames are cut along with the resin packages 59 to sizes of respective semiconductor devices 51 using a dicing saw, and the individual semiconductor devices 51 are thereby obtained.

As described above, by the present manufacturing method, the electrical characteristics of the plurality of semiconductor chips 53 are inspected in a batch (in one step) using the probe card 1 and the throughput in the inspection can thus be improved. Consequently, the time required for inspection of the semiconductor chips 53 can be shortened and manufacturing efficiency of the semiconductor devices 51 can be improved.

Figure 6:
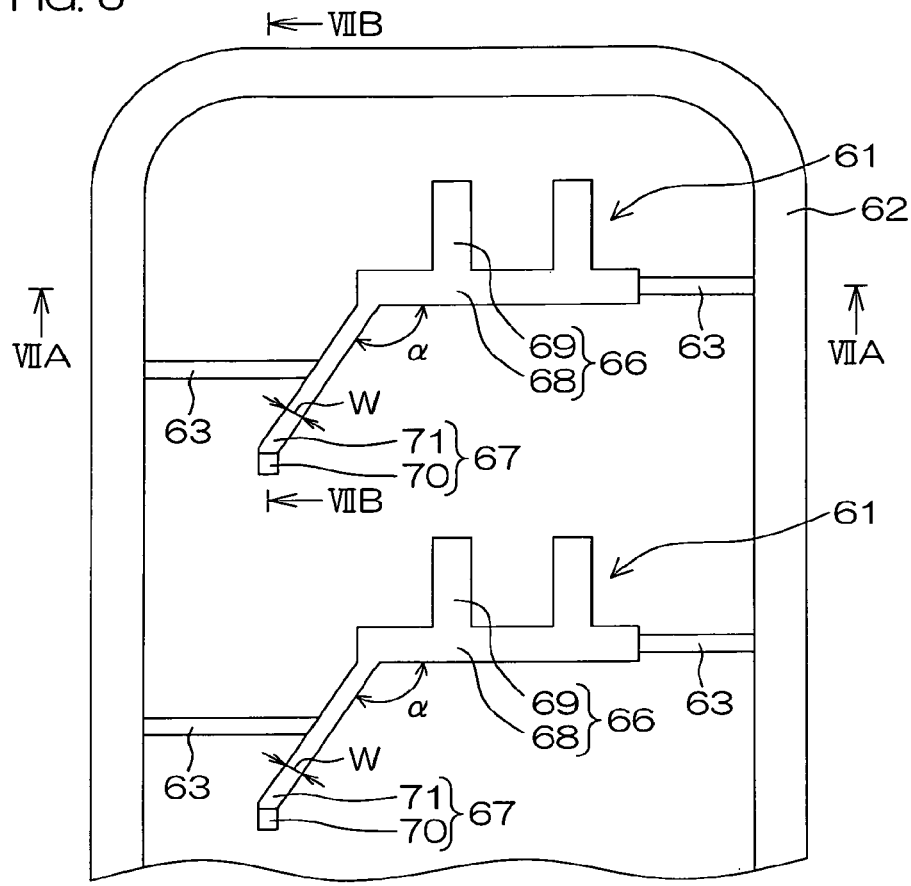
FIG. 6 is a schematic plan view of probes according to a preferred embodiment of the present invention.
Figure 7A:
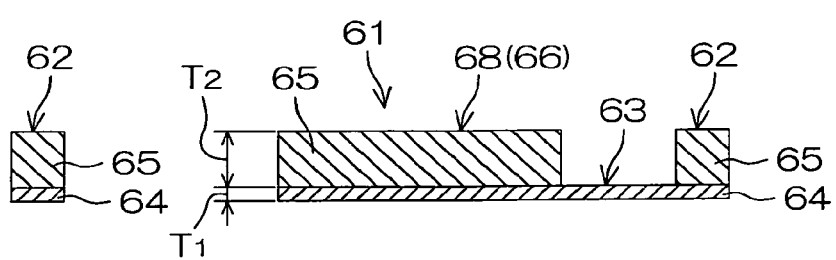
FIG. 7A is a schematic sectional view of a probe shown in FIG. 6 taken along sectioning line VIIA-VIIA.
Figure 7B:
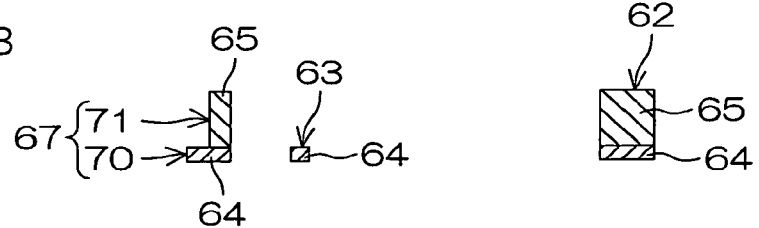
FIG. 7B is a schematic sectional view of the probe shown in FIG. 6 taken along sectioning line VIIB-VIIB.

FIG. 6 is a schematic plan view of probes according to a preferred embodiment of the present invention. FIG. 7A is a sectional view of a probe shown in FIG. 6 taken along sectioning line VIIA-VIIA. FIG. 7B is a sectional view of the probe shown in FIG. 6 taken along sectioning line VIIB-VIIB.

Each probe 61 is a cantilever type probe that is mounted to a probe card for inspection of electrical characteristics of a semiconductor chip (semiconductor device), and a plurality of the probes are surrounded as a single set by an outer frame 62. Connecting portions 63 are formed between each probe 61 and the outer frame 62. Each probe 61 is supported by the outer frame 62 via the connecting portions 63.

The probes 61, the outer frame 62, and the connecting portions 63 are formed integrally, and each portion is made of only a lower layer 64 with a relatively small thickness or of the lower layer 64 and an upper layer 65 of relatively large thickness that is selectively formed on the lower layer 64.

Each of the lower layer 64 and the upper layer 65 is made of a metal capable of being formed by a plating method and is made, for example, of nickel or a nickel alloy (for example, a nickel-manganese alloy, etc.). Also, a thickness $T_1$ of the lower layer 64 is, for example, 3 to 15 μm and preferably 8 to 12 μm. Meanwhile, a thickness $T_2$ of the upper layer 65 is, for example, 30 to 140 μm and preferably 45 to 55 μm. A total thickness $T_1+T_2$ that is the sum of the thickness of the lower layer 64 and the thickness of the upper layer 65 is, for example, 33 to 155 μm and preferably 53 to 67 μm.

Each probe 61 integrally includes a mounting portion 66 for mounting to a probe card and a needle portion 67 for inspection of a semiconductor chip.

An entirety of the mounting portion 66 is made of a lower layer 64 and an upper layer 65 and is formed to a uniform thickness as a whole. The mounting portion 66 integrally includes a main body portion 68 of rectangular flat plate form, and two plugs 69 of rectangular flat plate form that are connected to a wiring of the probe card.

The two plugs 69 extend perpendicular to one surface in a width direction of the main body portion 68 and are spaced apart from each other in a length direction of the main body portion 68.

The needle portion 67 integrally includes a tip portion 70 of substantially square flat plate form that contacts an external terminal of the semiconductor chip and a support portion 71 of rectangular flat plate form for supporting the tip portion 70 and is connected to the main body portion 68 of the mounting portion 66.

An entirety of the support portion 71 is made of a lower layer 64 and an upper layer 65 and is formed to a uniform thickness as a whole. The support portion 71 is connected to one end portion (left side end portion in FIG. 6) of another surface in the width direction of the main body portion 68 (surface opposite to the side on which the plugs 69 are provided). The support portion 71 extends in a direction that forms an obtuse angle (for example, $\alpha=14°$) with respect to the other surface in the width direction of the main body portion 68.

Also, a width W of the support portion 71 is, for example, 100 to 400 μm. By the support portion 71 being made of the lower layer 64 and the upper layer 65 and the width W of the support portion 71 being in the above range, the support portion 71 can be provided with a suitable spring characteristic. By such a spring characteristic, the tip portion 70 can be made to contact an external terminal satisfactorily and damaging of the external terminal due to contact with the tip portion 70 can also be suppressed.

An entirety of the tip portion 70 is made of the lower layer 64 and projects from a tip of the support portion 71 in a direction opposite to the direction of extension of the plugs 69 with respect to the main body portion 68.

That is, among the support portion 71 and the tip portion 70 at the needle portion 67, the upper layer 65 is selectively formed only at the support portion 71.

An entirety of the outer frame 62 is made of the lower layer 64 and the upper layer 65 and is formed to a substantially rectangular annular shape that surrounds the probes 61 across a gap.

An entirety of each connecting portion 63 is made of the lower layer 64 and is formed to a rectangular flat plate form. Two connecting portions 63 are provided as one set with respect to one probe 61. The connecting portions 63 of one set are connected one each to each of long sides of the outer frame 62 that oppose to each other via the probe 61. Both connecting portions 63 of one set extend in a direction perpendicular to the sides of the outer frame 62, and one connecting portion 63 is connected to the support portion 71 of the probe 61 while the other connecting portion 63 is connected to the main body portion 68 of the probe 61.

FIG. 8A to FIG. 8F are schematic sectional views illustrating a method for forming the probes shown in FIG. 6 in order of process. With FIG. 8A to FIG. 8F, a drawing positioned at a left side is a sectional view taken along the same sectioning plane as FIG. 7A, and a drawing positioned at aright side is a sectional view taken along the same sectioning plane as FIG. 7B.

Figure 8A:
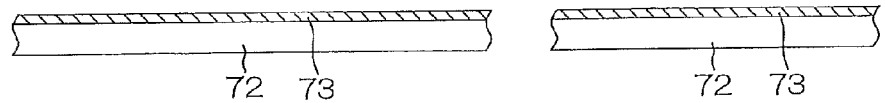
FIG. 8A is a schematic sectional view illustrating a method for forming the probes shown in FIG. 6.

To form the probes shown in FIG. 6 and FIGS. 7A and 7B, first, a plating underlayer 73 is formed, for example, by a sputter method across an entire surface of a silicon substrate 72 as a semiconductor substrate as shown in FIG. 8A. The plating underlayer 73 is a film made of a metal material that differs from the materials of the lower layer 64 and the upper layer 65 and is made, for example, of a Ti/Cu laminated film or a TiW/Au laminated film, etc.

Figure 8B:
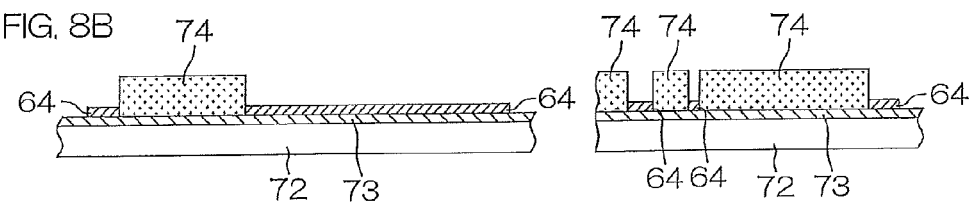
FIG. 8B is a schematic sectional view of a step subsequent to the step of FIG. 8A.
Figure 8C:
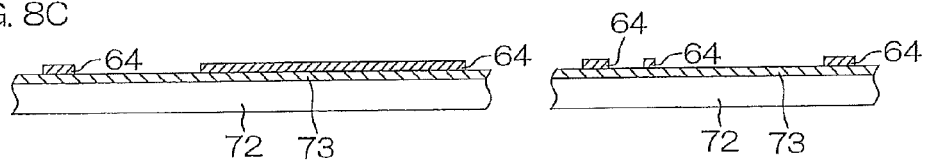
FIG. 8C is a schematic sectional view of a step subsequent to the step of FIG. 8B.

Next, as shown in FIG. 8B, a resist mask 74 having openings at regions at which the probes 61, outer frame 62, and the connecting portions 63 are to be formed is formed. Then, for example, by an electrolytic plating method, the material of the lower layer 64 is grown by plating from the portions exposed from the resist mask 74. The lower layer 64 is thereby formed selectively as a first plating layer on the plating underlayer 73 as shown in FIG. 8B. The portions of the plating underlayer 73 at which the lower layer 64 is not formed is exposed from the lower layer 64. After the forming of the lower layer 64, the resist mask 74 is removed as shown in FIG. 8C.

Figure 8D:
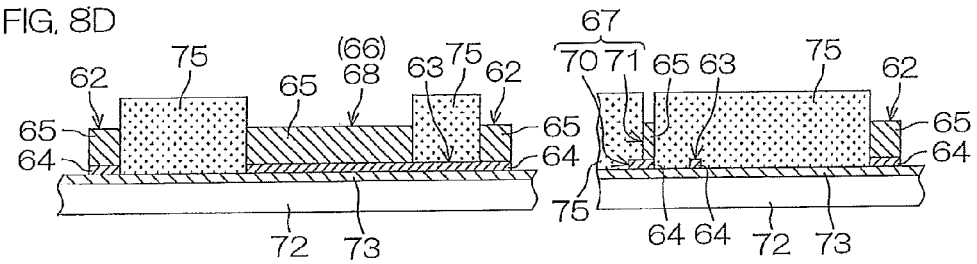
FIG. 8D is a schematic sectional view of a step subsequent to the step of FIG. 8C.
Figure 8E:
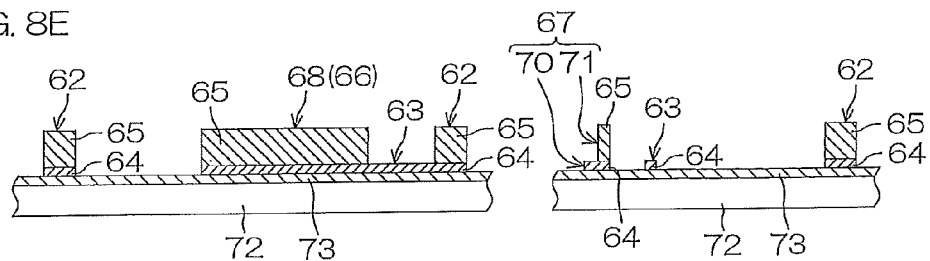
FIG. 8E is a schematic sectional view of a step subsequent to the step of FIG. 8D.

Then, as shown in FIG. 8D, a resist mask 75 is formed to cover regions of the lower layer 64 and regions of the plating underlayer 73 exposed from the lower layer 64 at which the connecting portions 63 and the tip portions 70 are to be formed. Then, for example, by the electrolytic plating method, the material of the upper layer 65 is grown by plating from the portions exposed from the resist mask 75. The upper layer 65 is thereby formed selectively as a second plating layer on the lower layer 64 as shown in FIG. 8D. The respective portions made of the lower layer 64 and the upper layer 65 (the outer frame 62, the mounting portions 66, and the support portions 71) and the respective portions made of the lower layer 64 (the connecting portions 63 and the tip portions 70) are thereby formed selectively on the silicon substrate 72. Thereafter, the resist mask 75 is removed as shown in FIG. 8E.

Figure 8F:
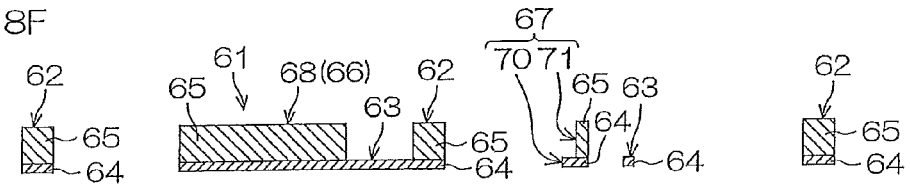
FIG. 8F is a schematic sectional view of a step subsequent to the step of FIG. 8E.

Next, as shown in FIG. 8F, the plating underlayer 73 is etchingly removed, for example, by wet etching using an etching solution (for example, ammonia water) with which the lower layer 64 and the upper layer 65 are substantially unetched and yet the etching rate with respect to the plating underlayer 73 is large. The structures made of the lower layer 64 and the upper layer 65 are thereby separated (lifted off) from the silicon substrate 72. By then cutting portions of the connecting portions 63 that are connected to the probes 61, the probes 61 that are separated from the outer frame 62 are obtained.

The probes 61 obtained as described above are mounted to a probe card 76 such as shown in FIG. 9.

Figure 9A:
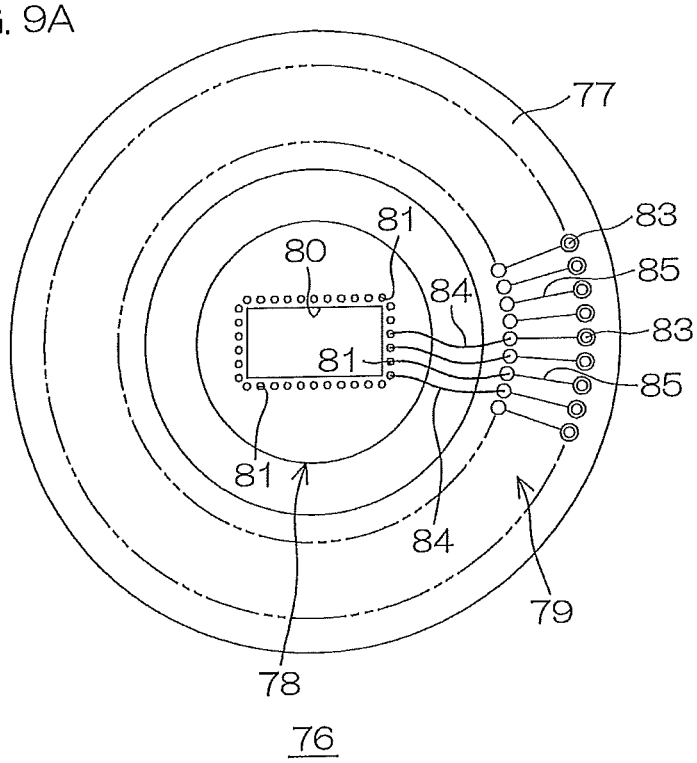
FIG. 9A is a schematic plan view of a probe card to which the probes shown in FIG. 6 are mounted.
Figure 9B:
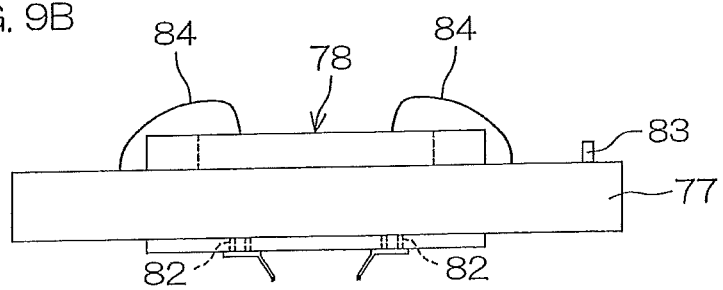
FIG. 9B is a schematic side view of the probe card to which the probes shown in FIG. 6 are mounted.

FIG. 9A is a schematic plan view of the probe card onto which the probes shown in FIG. 6 are mounted. FIG. 9B is a schematic side view of the probe card to which the probes shown in FIG. 6 are mounted.

The probe card 76 is a device by which electrical characteristics of semiconductor chips formed on a semiconductor wafer are inspected one chip at a time and includes a disk-shaped ceramic substrate 77.

The ceramic substrate 77 is provided with a wiring unit 78 to which the probes 61 are mounted and a connecting unit 79 for connecting the probe card 76 and a prober device (not shown).

The wiring unit 78 is disposed at a central portion of the ceramic substrate 77 and is formed to a disk-like shape having a center in common with the ceramic substrate 77. The wiring unit 78 has a greater thickness than the ceramic substrate 77 and projects from each of one surface and another surface of the ceramic substrate 77. A through-hole 80 of rectangular shape in plan view that penetrates through from one side to another side of the wiring unit 78 is formed in a substantially central portion of the wiring unit 78.

A plurality of wiring receptacles 81 to which wirings 84, to be described below, are connected are formed on the one side (side of mounting to the probe device) of the wiring unit 78. The plurality of wiring receptacles 81 are provided, for example, at the same number as external terminals of the semiconductor chip that is the subject of inspection and are aligned in a rectangular annular form along an outer periphery of the through-hole 80.

Also, plug receptacles 82 for connection of the probes 61 are disposed at the other side (semiconductor chip inspection side) of the wiring unit 78. The plug receptacles 82 are formed to shapes enabling fitting of the plugs 69 of the probes 61 and one each is disposed at a position opposing each wiring receptacle 81. That is, at the other side of the wiring unit 78, the same number of plug receptacles 82 as the number of the wiring receptacles 81 are aligned in a rectangular annular form along an outer periphery of the through-hole 80. The plug receptacles 82 are electrically connected to the wiring receptacles 81 inside the wiring unit 78.

By the plugs 69 being inserted in the respective plug receptacles 82 so that the needle portion 67 of the probe 61 is directed toward an inner side of the wiring unit 78, each probe 61 is mounted to the wiring unit 78 in an orientation where the long side at the plug 69 side of the main body portion 68 is put in contact vertically with the other surface of the wiring unit 78. The plurality of probes 61 that are mounted to all of the plug receptacles 82 are thereby aligned along the peripheral direction of the through-hole 80 as a whole and disposed so that the tip portions 70 of mutually adjacent probes 61 oppose to each other in the thickness direction. That is, in the probe card 76, an interval between mutually adjacent tip portions 70 in the opposing direction is the pitch of the probes 61. The probes 61 mounted to the plug receptacles 82 are electrically connected to the connecting unit 79 via the wirings 84.

The connecting unit 79 has connecting terminals 83 for connection with the prober device (not shown), the wirings 84 connected to the wiring receptacles 81, and relay wirings 85 relaying the connections of the connecting terminals 83 and the wirings 84.

Each connecting terminal 83 has a needle-like form that is pointed toward an outer side of the thickness direction of the ceramic substrate 77 and a plurality (the same number as the plug receptacles 82) are provided along an entire periphery of the ceramic substrate 77 at an outer peripheral edge portion of the ceramic substrate 77. In FIGS. 9A and 9B, only a portion of the plurality of connecting terminals 83 are shown (the same applies to the wirings 84 and the relay wirings 85).

On the ceramic substrate 77, the relay wirings 85 extend from the connecting terminals 83 toward a center of the ceramic substrate 77, and the wirings 84 are connected to tip portions thereof.

To inspect the electrical characteristics of semiconductor chips using the probe card 76, for example, the probe card 76 is first positioned above a single semiconductor chip on a semiconductor wafer and the probes 61 are put in contact with all external terminals of the semiconductor chip so that one probe 61 corresponds to one external terminal. Electrical signals are then input from the prober device into the input terminals of the semiconductor chip. Electrical signals output from the output terminals in accordance with the input signals are then read by the probe device, and the signal waveforms of the output signals are compared with expected values stored in the probe device in advance. By this comparison, the qualities of the electric characteristics of the inspected chip are judged.

As described above, with each probe 61, the tip portion 70, which is provided in the needle portion 67 for inspecting a semiconductor chip and contacts an external terminal of the semiconductor chip, is made of the lower layer 64 of relatively small thickness (for example, 3 to 15 µm). Also, the support portion for supporting the tip portion 70 is made of the lower layer 64 and the upper layer 65 of relatively large thickness (for example, 30 to 140 µm). Thus, even if the pitch of the probes 61 (the interval between mutually adjacent tip portions 70) is made narrow in accordance with the pitch of the external terminals of the semiconductor chip, mutual contact of adjacent probes 61 can be prevented by designing the thickness of the lower layer 64 to be an appropriate thickness.

The probes 61 that can accommodate the narrowing of the pitch of the external terminals of the semiconductor chip can thus be formed by the above-described method. Consequently, the electrical characteristics of the semiconductor chip can be inspected with good precision using the probes 61 formed by the above method.

Further, the tip portion 70 of relatively small thickness is formed by the plating method in the process of forming the probe 61. There is thus no need to polish or otherwise process the tip portion 70 after preparation of the probe 61. The probes 61 having the tip portions 70 of relatively small thickness can thus be formed easily without trouble.

Also, with the above method, the outer frame 62 that surrounds the probe 61 and the connecting portions 63 that connect the outer frame 62 to the probe 61 are formed. The probe 61 is supported by the outer frame 62 via the connecting portions 63 and thus, by separating the outer frame 62 from the silicon substrate 72 in the lift-off step, the probe 61 can be separated easily from the semiconductor substrate 72 in accompaniment.

Further, the outer frame 62 is made of the lower layer 64 and the upper layer 65, and the connecting portions 63 are made of the lower layer 64. The outer frame 62 and the connecting portions 63 can thus be formed in the same process as the probe 61 that is made of the lower layer 64 and the upper layer 65. Also, the connecting portions 63 are made of the lower layer 64 of relatively small thickness, and thus the portions of the connecting portions 63 connected to the probe 61 can be cut off easily after the separation of the outer frame 62 (probe 61) and the semiconductor substrate 72.

Also, the lower layer 64 is formed using the metal material that differs from that of the plating underlayer 73, and thus, by the lift-off method that makes use of the difference of the etching rates of the lower layer 64 and the plating underlayer 73, the structures made of the lower layer 64 and the upper layer 65 can be separated easily from the semiconductor substrate 72.

Although preferred embodiments of the present invention have been described above, the present invention can be put into practice in other modes as well.

For example, the number of partitions of the inspection portion 4 can be changed as suited. By increasing the number of partitions, all of the semiconductor chips on a single wafer (for example, approximately 100000 chips) or chips corresponding to a single shot unit of patterning by a single reticle (for example, approximately 1000 chips) can be inspected in a batch.

Also, the form of layout of the unit cells 5 is not restricted to lattice windows. For example, the plurality of unit cells 5 may be disposed in a staggered form in which the respective unit cells 5 in each column and the respective unit cells 5 in a column adjacent to the column are positioned in an alternating manner.

Also, for example, although as the package type of the semiconductor device 51 manufactured using the probe card 1, a semiconductor device of the QFN type was taken up in the above description of the preferred embodiment, the method for manufacturing semiconductor device according to the present invention can also be applied to methods of manufacturing semiconductor devices of other package types, such as SON (small outlined non-leaded package), QFP (quad flat package), SOP (small outline package), etc.

Also, for example, although a cantilever type probe was taken up as an example of the probe according to the present invention in the above description of the preferred embodiment of the method for forming a probe, the method for forming probe according to the present invention can also be applied to vertical type probes.

Also, the outer frame 62 and the connecting portions 63 do not have to be formed. Also, in the case where the outer frame 62 and the connecting portions 63 are formed as in the preferred embodiment described above, the outer frame 62 may be made of only the lower layer 64.

Also, in regard to the materials of the lower layer 64, the upper layer 65, and the plating underlayer 73, suitable metals besides the metals indicated above as examples may be used as well.

While preferred embodiments of the present invention have been described in detail above, these are merely specific examples used to clarify the technical contents of the present invention and the present invention should not be interpreted restrictively to these specific examples and the spirit and scope of the present invention is to be determined solely by the following claims.

DESCRIPTION OF THE SYMBOLS

1 . . . probe card, 2 . . . silicon substrate, 6 . . . probe, 15 . . . through-hole, 16 . . . through electrode, 18 . . . routed wiring, 2A . . . one surface (of the silicon substrate), 2B . . . other surface (of the silicon substrate), 51 . . . semiconductor device, 52 . . . semiconductor wafer, 53 . . . semiconductor chip, 54 . . . electrode pad, 61 . . . probe, 62 . . . outer frame, 63 . . . connecting portion, 64 . . . lower layer, 65 . . . upper layer, 70 . . . tip portion, 71 . . . support portion, 72 . . . silicon substrate, 73 . . . plating underlayer, 75 . . . resist mask

What is claimed is:

1. A probe card, comprising:
a board;
a plurality of probes at a first surface of the board and brought in contact with external terminals of a semiconductor device, each probe of the plurality of probes having a first vertical portion extending vertically upward with respect to the first surface of the board and a first extending portion extending along the first surface of the board;
a plurality of through-holes formed in correspondence to a respective probe of the plurality of probes at an opposing position of the first vertical portion in a thickness direction of the board and penetrating between the first surface of the board and a second surface of the board;
through electrodes embedded in the respective through-holes and conductively connected to the probes in the respective through-holes; and
a wiring at the second surface of the board and conductively connected to the through electrodes, the wiring having a second extending portion extending along the second surface of the board,
wherein the first extending portion and the second extending portion extend in different directions from each other, and a space is formed across the entire width of the first extending portion between the first extending portion and the first surface of the board.

2. The probe card according to claim 1, wherein the through electrodes and the wiring are made of plating metal.

3. The probe card according to claim 1, wherein the through electrodes and the wiring are fabricated integrally with the board.

4. The probe card according to claim 1, wherein the board includes a silicon-based board.

5. The probe card according to claim 1, wherein the probe card inspects electrical characteristics of a plurality of semiconductor devices in a batch.

6. The probe card according to claim 1, comprising a gap between the plurality of probes and the board.

7. The probe card according to claim 1, comprising a substrate wiring formed selectively over the first surface of the board.

8. The probe card according to claim 7, further comprising an insulating layer between the substrate wiring and the first surface of the board.

9. The probe card according to claim 7, wherein the plurality of probes extend over a surrounding area of the substrate wiring.

10. The probe card according to claim 7, wherein the through-hole has a width that is smaller than a width of the substrate wiring.

11. A probe card, comprising:
a board;
a plurality of terminals at a first surface of the board and brought in contact with external terminals of a facing opponent, each terminal of the plurality of terminals having a first vertical portion extending vertically upward with respect to the first surface of the board and a first extending portion extending along the first surface of the board;
a plurality of through-holes formed in correspondence to a respective terminal of the plurality of terminals at an opposing position of the first vertical portion in a thickness direction of the board and penetrating between the first surface of the board and a second surface of the board;
through electrodes embedded in the respective through-holes and conductively connected to the terminals in the respective through-holes; and
a wiring at the second surface of the board and conductively connected to the through electrodes, the wiring having a second extending portion extending along the second surface of the board,
wherein the first extending portion and the second extending portion extend in different directions from each other, and a space is formed across the entire width of the first extending portion between the first extending portion and the first surface of the board.

12. The probe card according to claim 11, wherein the through electrodes and the wiring are made of plating metal.

13. The probe card according to claim 11, wherein the through electrodes and the wiring are fabricated integrally with the probe card.

14. The probe card according to claim 11, wherein a part of the terminals are made of copper.

15. The probe card according to claim 2, wherein the through electrodes and the wiring are made of copper.

16. The probe card according to claim 12, wherein the through electrodes and the wiring are made of copper.

17. A probe card comprising:
a silicon substrate;
a plurality of terminals at a first surface of the silicon substrate and brought in contact with external terminals of a facing opponent, each terminal of the plurality of terminals having a first vertical portion extending vertically upward with respect to the first surface of the board and a first extending portion extending along the first surface of the silicon substrate;
a plurality of through-holes formed in correspondence to a respective terminal of the plurality of terminals at an opposing position of the first vertical portion in a thickness direction of the board and penetrating between the first surface of the silicon substrate and a second surface of the silicon substrate;

through electrodes embedded in the respective through-holes and conductively connected to the terminals in the respective through-holes; and a wiring at the second surface of the silicon substrate and conductively connected to the through electrodes, the wiring having a second extending portion extending along the second surface of the silicon substrate, wherein the first extending portion and the second extending portion extend in different directions from each other, and a space is formed across the entire width of the first extending portion between the first extending portion and the first surface of the silicon substrate.

18. The probe card according to claim 17, wherein the through electrodes and the wiring are made of plating metal.

19. The probe card according to claim 17, wherein the through electrodes and the wiring are fabricated integrally with the probe card.

20. The probe card according to claim 17, wherein a part of the terminals are made of copper.

* * * * *